United States Patent
Sonoda et al.

(10) Patent No.: US 11,732,164 B2
(45) Date of Patent: Aug. 22, 2023

(54) LOW-DIELECTRIC ADHESIVE COMPOSITION

(71) Applicant: TOYOBO CO., LTD., Osaka (JP)

(72) Inventors: Ryo Sonoda, Shiga (JP); Tadahiko Mikami, Shiga (JP); Tetsuo Kawakusu, Shiga (JP)

(73) Assignee: TOYOBO MC CORPORATION, Osaka (JP)

( * ) Notice: Subject to any disclaimer, the term of this patent is extended or adjusted under 35 U.S.C. 154(b) by 271 days.

(21) Appl. No.: 16/767,251

(22) PCT Filed: May 17, 2019

(86) PCT No.: PCT/JP2019/019658
§ 371 (c)(1),
(2) Date: May 27, 2020

(87) PCT Pub. No.: WO2019/230445
PCT Pub. Date: Dec. 5, 2019

(65) Prior Publication Data
US 2021/0002523 A1    Jan. 7, 2021

(30) Foreign Application Priority Data

May 28, 2018  (JP) ................................ 2018-101490
May 28, 2018  (JP) ................................ 2018-101491

(51) Int. Cl.
| | | |
|---|---|---|
| *C09J 11/06* | (2006.01) | |
| *C09J 7/30* | (2018.01) | |
| *C09J 11/08* | (2006.01) | |
| *C08L 63/00* | (2006.01) | |
| *C08L 79/08* | (2006.01) | |
| *C08K 5/06* | (2006.01) | |
| *H05K 1/03* | (2006.01) | |
| *B32B 15/09* | (2006.01) | |
| *B32B 15/12* | (2006.01) | |
| *B32B 15/20* | (2006.01) | |
| *B32B 27/10* | (2006.01) | |
| *B32B 15/18* | (2006.01) | |
| *C09J 123/26* | (2006.01) | |
| *H05K 1/02* | (2006.01) | |
| *H05K 1/05* | (2006.01) | |

(52) U.S. Cl.
CPC .............. *C09J 123/26* (2013.01); *C09J 11/06* (2013.01); *H05K 1/028* (2013.01); *H05K 1/056* (2013.01); *H05K 2201/0154* (2013.01); *H05K 2201/0355* (2013.01)

(58) Field of Classification Search
None
See application file for complete search history.

(56) References Cited

U.S. PATENT DOCUMENTS

| | | | | |
|---|---|---|---|---|
| 4,104,323 | A * | 8/1978 | Hansen ................. | C09J 153/02 524/505 |
| 5,189,103 | A * | 2/1993 | Abe ....................... | C08G 18/08 525/391 |
| 2007/0054142 | A1 * | 3/2007 | Lee ......................... | B32B 27/34 428/522 |
| 2012/0315476 | A1 * | 12/2012 | Ogawa ................... | C09J 7/385 428/355 R |
| 2017/0297302 | A1 | 10/2017 | Okimura et al. | |

FOREIGN PATENT DOCUMENTS

| | | |
|---|---|---|
| JP | 2014-34668 | 2/2014 |
| JP | 2016-210856 | 12/2016 |
| JP | 2017-197597 | 11/2017 |
| WO | 2014/147903 | 9/2014 |
| WO | 2016/031342 | 3/2016 |
| WO | 2016/047289 | 3/2016 |
| WO | 2017/029917 | 2/2017 |

OTHER PUBLICATIONS

Extended European Search Report dated Jul. 12, 2021 in European Patent Application No. 19810254.3.
International Search Report (ISR) dated Jul. 2, 2019 in International (PCT) Application No. PCT/JP2019/019658.

* cited by examiner

*Primary Examiner* — Sheeba Ahmed
(74) *Attorney, Agent, or Firm* — Wenderoth, Lind & Ponack, L.L.P.

(57) ABSTRACT

The present invention aims to provide an adhesive composition which exhibits high adhesive property not only to the conventional polyimide and polyester film but also to a metal substrate, can achieve high solder heat resistance and exhibits excellent low-dielectric characteristics. According to the present invention, there is provided an adhesive composition containing an acid-modified polyolefin (a), an oligo-phenylene ether (b) having a number-average molecular weight of 3000 or less, and an epoxy resin (c), wherein the adhesive composition satisfies the following requirement (s) (A) and/or (B):

(A) The adhesive composition contains more than 20 parts by mass and 60 parts by mass or less of the epoxy resin (c) to 100 parts by mass of the acid-modified polyolefin (a);
(B) The adhesive composition further contains a polycarbodiimide (d).

9 Claims, No Drawings

LOW-DIELECTRIC ADHESIVE COMPOSITION

TECHNICAL FIELD OF THE INVENTION

The present invention relates to an adhesive composition. More particularly, it relates to an adhesive composition used for adhesion of a resin substrate to a resin substrate or to a metal substrate. More specifically, the present invention relates to an adhesive composition for a flexible printed-circuit board (Hereinafter, it may be also called an FPC.), as well as to a coverlay film, a laminate, a copper foil with resin and a bonding sheet containing the same.

BACKGROUND ART

Since a flexible printed-circuit board (FPC) has excellent flexibility, it can cope with demands for multi-functionalization and miniaturization of personal computers (PC), smartphones, etc. Therefore, FPC has been widely used for incorporating an electronic circuit board into a narrow and complicated inner area. In recent years, making electronic devices into small size, light weight, high density and high output has been in progress. Therefore, due to the trend as such, demands for properties of the printed-circuit board (electronic circuit board) have become higher and higher. Especially as result of speeding-up of transmission signals in FPC, making the signals into a higher frequency has been in progress. As a result thereof, demands for low-dielectric characteristics (low-dielectric constant, low-dielectric tangent) in the high frequency region have increased for FPC. In order to achieve the low-dielectric characteristics as such, there has been attempted a means for reducing a dielectric loss of a substrate and adhesive for FPC. With regard to the adhesive, a combination of polyolefin with epoxy (Patent Document 1) and a combination of elastomer with epoxy (Patent Document 2) have been proposed.

PRIOR ART DOCUMENTS

Patent Documents

Patent Document 1: WO 2016/047289
Patent Document 2: WO 2014/147903

DISCLOSURE OF THE INVENTION

Problem that the Invention is to Solve

However, in Patent Document 1, it is hard to say that, in case the adhesive is used in a reinforcing plate or between layers, the adhesive exhibits excellent heat resistance. In addition, in Patent Document 2, a stability during storage after compounding (which is important in an actual use) is not sufficient.

The inventors of the present invention have conducted extensive investigations for solving the above problems. As a result, they have found that an adhesive composition having specific properties is excellent in terms of high adhesive property to the conventional resin substrate such as polyimide film and metal substrate such as copper foil, as well as in terms of solder heat resistance and pot life property after compounding, whereupon they have achieved the present invention.

An object of the present invention is to provide an adhesive composition which exhibits good adhesive property to both of various resin substrates such as polyimide and metal substrates, and which exhibits excellent solder heat resistance and pot life property.

Means for Solving the Problem

An adhesive composition containing an acid-modified polyolefin (a), an oligo-phenylene ether (b) having a number-average molecular weight of 3000 or less, and an epoxy resin (c), wherein the adhesive composition satisfies the following requirement(s) (A) and/or (B):

(A) The adhesive composition contains more than 20 parts by mass and 60 parts by mass or less of the epoxy resin (c) to 100 parts by mass of the acid-modified polyolefin (a);

(B) The adhesive composition further contains a polycarbodiimide (d).

It is preferred that an acid value of the acid-modified polyolefin (a) is 5 to 40 mg KOH/g. It is preferred that the oligo-phenylene ether (b) having a number-average molecular weight of 3000 or less has a structural unit of the following formula (I) and/or a structural unit of the following formula (II).

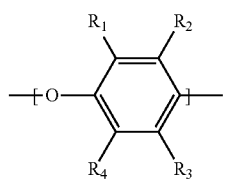
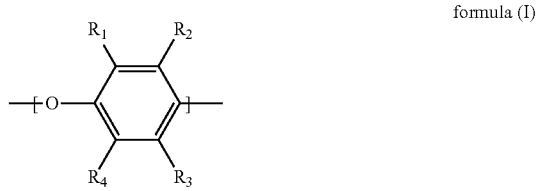

formula (I)

In the formula (I), $R_1$, $R_2$, $R_3$ and $R_4$ each independently represents a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted.

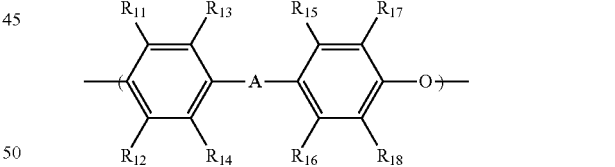

formula (II)

In the formula (II), $R_{11}$, $R_{12}$, $R_{13}$, $R_{14}$, $R_{15}$, $R_{16}$, $R_{17}$ and $R_{18}$ each independently represents a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted; and A is a linear, branched or cyclic divalent hydrocarbon group having a number of carbon atoms of 20 or less, or oxygen.

It is preferred that the adhesive composition contains 0.05 to 200 part(s) by mass of the oligo-phenylene ether (b) having a number-average molecular weight of 3000 or less and 0.5 to 20 part(s) by mass of the polycarbodiimide (d) to 100 parts by mass of the acid-modified polyolefin (a).

It is preferred that the adhesive composition has a relative dielectric constant ($\varepsilon_c$) at 1 GHz of 3.0 or less and a dielectric tangent (tan δ) at 1 GHz of 0.02 or less.

An adhesive sheet or a laminate containing the adhesive composition. A printed-circuit board containing the laminate as a constituting element.

Advantages of the Invention

The adhesive composition of the present invention exhibits good adhesive property to both of various resin substrates such as polyimide and metal substrates, and exhibits excellent solder heat resistance and pot life property.

BEST MODE FOR CARRYING OUT THE INVENTION

<Acid-Modified Polyolefin (a)>

Although the acid-modified polyolefin (a) which is used in the present invention (Hereinafter, it may be also referred to just as an ingredient (a).) is not particularly limited, it is preferred to be such a thing which is prepared by grafting at least one member selected from an α,β-unsaturated carboxylic acid and an acid anhydride thereof onto a polyolefin resin. The polyolefin resin stands for a polymer mainly comprising a hydrocarbon skeleton such as a homopolymer of olefin monomer being exemplified as ethylene, propylene, butene, butadiene and isoprene, a copolymer with other monomer and a hydride, a halide or the like of the resulting polymer. The acid-modified polyolefin is preferred to be such a thing which is prepared by grafting of at least one member selected from an α,β-unsaturated carboxylic acid and an acid anhydride thereof onto at least one member selected from polyethylene, polypropylene and propylene-α-olefin copolymer.

The propylene-α-olefin copolymer is prepared by copolymerization of propylene as a main ingredient with α-olefin. As to the α-olefin, there may be used, for example, one or more member(s) selected from ethylene, 1-butene, 1-heptene, 1-octene, 4-methyl-1-pentene and vinyl acetate. Among the α-olefins as such, ethylene and 1-butene are preferred. Although a ratio of the propylene ingredient to the α-olefin ingredient in the propylene-α-olefin copolymer is not limited, it is preferred that the propylene ingredient occupies 50 molar % or more, and preferably 70 molar % or more.

As to the at least one member selected from the α,β-unsaturated carboxylic acid and the acid anhydride thereof, there may be exemplified maleic acid, itaconic acid, citraconic acid and acid anhydride thereof. Among the above, an acid anhydride is preferred and maleic anhydride is more preferred. To be more specific, there may be exemplified polypropylene modified with maleic anhydride, propylene-ethylene copolymer modified with maleic anhydride, propylene-butene copolymer modified with maleic anhydride and propylene-ethylene-butene copolymer modified with maleic anhydride. One of those acid-modified polyolefins may be used solely or two or more thereof may be used jointly.

As to an acid value of the acid-modified polyolefin (a), its lower limit is preferred to be 5 mg KOH/g or more, more preferred to be 6 mg KOH/g or more, and further preferred to be 7 mg KOH/g or more, in view of its heat resistance and adhesive property to resin substrates and metal substrates. When the acid value of the acid-modified polyolefin (a) is above the lower limit, compatibility with the epoxy resin (c) becomes good and excellent adhesive strength can be achieved. In addition, crosslinking density becomes high and heat resistance becomes good. The upper limit is preferred to be 40 mg KOH/g or less, more preferred to be 30 mg KOH/g or less, and further preferred to be 20 mg KOH/g or less. When the acid value of the acid-modified polyolefin (a) is below the upper limit, adhesive property becomes good. In addition, viscosity and stability of the solution become good and an excellent pot life property can be achieved. Moreover, production efficiency is enhanced as well.

A number-average molecular weight (Mn) of the acid-modified polyolefin (a) is preferred to be within a range of 10,000 to 50,000, more preferred to be within a range of 15,000 to 45,000, further preferred to be within a range of 20,000 to 40,000, and particularly preferred to be within a range of 22,000 to 38,000. When the number-average molecular weight (Mn) of the acid-modified polyolefin (a) is above the lower limit, cohesive force becomes good and excellent adhesive property can be achieved. When the number-average molecular weight (Mn) of the acid-modified polyolefin (a) is below the upper limit, fluidity is excellent and operability becomes good.

It is preferred that the acid-modified polyolefin (a) is a crystalline polyolefin modified with an acid. The term "crystalline" in the present invention stands for such a case wherein, when the acid-modified polyolefin is heated at 20° C./minute from −100° C. to 250° C. using a differential scanning calorimeter (DSC), there is shown a clear melting peak during the temperature-rising process.

A melting point (Tm) of the acid-modified polyolefin (a) is preferred to be within a range of 50° C. to 120° C., more preferred to be within a range of 60° C. to 100° C., and most preferred to be within a range of 70° C. to 90° C. When the melting point (Tm) of the acid-modified polyolefin (a) is above the lower limit, cohesive force inherent to crystals becomes good and excellent adhesive force and heat resistance can be achieved. When the melting point (Tm) of the acid-modified polyolefin (a) is below the upper limit, solution stability and fluidity are excellent and operability during the adhesion becomes good.

A heat of melting of the acid-modified polyolefin (a) (ΔH) is preferred to be within a range of 5 J/g to 60 J/g, more preferred to be within a range of 10 J/g to 50 J/g, and most preferred to be within a range of 20 J/g to 40 J/g. When the heat of melting of the acid-modified polyolefin (a) is above the lower limit, cohesive force inherent to crystals becomes good and excellent adhesive force and heat resistance can be achieved. When the heat of melting of the acid-modified polyolefin (a) is below the upper limit, solution stability and fluidity are excellent and operability during the adhesion becomes good.

As to a method for preparing the acid-modified polyolefin (a), there is no particular limitation and there may be exemplified a radical graft reaction (i.e. a reaction wherein a radical member is formed for a polymer which is to become a main chain and then unsaturated carboxylic acid and acid anhydride are subjected to a graft polymerization using the radical member as a polymerization starting point).

Although there is no particular limitation for a radical generator, it is preferred to use an organic peroxide. As to the organic peroxide, there is no particular imitation and there may be exemplified a peroxide such as di-tert-butyl peroxyphthalate, tert-butyl hydroperoxide, dicumyl peroxide, benzoyl peroxide, tert-butyl peroxybenzoate, tert-butylperoxy 2-ethylhexanoate, tert-butyl peroxypivalate, methyl ethyl ketone peroxide, di-tert-butyl peroxide and lauroyl peroxide; and an azonitrile such as azobisisobutyronitrile and azobisisopropionitrile.

<Oligo-phenylene ether (b)>

A number-average molecular weight (Mn) of the oligo-phenylene ether (b) which is used in the present invention (Hereinafter, it may be also referred to just as an ingredient (b).) is 3000 or less. As to the ingredient (b), it is preferred to use a compound having a structural unit represented by the following formula (I) and/or a compound having a structural unit represented by the following formula (II).

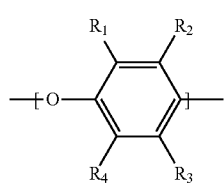

formula (I)

In the formula (I), $R_1$, $R_2$, $R_3$ and $R_4$ each independently is preferred to be a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted. The "alkyl group" in the alkyl group which may be optionally substituted is a linear or branched alkyl group having, for example, a number of carbon atoms of 1 to 6, and preferably 1 to 3. To be more specific, there may be exemplified methyl group, ethyl group, propyl group, isopropyl group, butyl group, isobutyl group, sec-butyl group, tert-butyl group, pentyl group and hexyl group. Methyl group or ethyl group is more preferable. As to the "alkenyl group" in the alkenyl group which may be optionally substituted, there may be exemplified ethenyl group, 1-propenyl group, 2-propenyl group, 3-butenyl group, pentenyl group and hexenyl group. Ethenyl group or 1-propenyl group is more preferable. As to the "alkynyl group" in the alkynyl group which may be optionally substituted, there may be exemplified ethynyl group, 1-propynyl group, 2-propynyl (propargyl) group, 3-butynyl group, pentynyl group and hexynyl group. Ethynyl group, 1-propynyl group or 2-propynyl (propargyl) group is more preferable. As to the "aryl group" in the aryl group which may be optionally substituted, there may be exemplified phenyl group and naphthyl group. Phenyl group is more preferable. As to the "aralkyl group" in the aralkyl group which may be optionally substituted, there may be exemplified benzyl group, phenethyl group, 2-methylbenzyl group, 4-methylbenzyl group, α-methylbenzyl group, 2-vinylphenethyl group and 4-vinylphenethyl group. Benzyl group is more preferable. The "alkoxy group" in the alkoxy group which may be optionally substituted is a linear or branched alkoxy group having, for example, a number of carbon atoms of 1 to 6, and preferably 1 to 3. There may be exemplified methoxy group, ethoxy group, propoxy group, isopropoxy group, butoxy group, sec-butoxy group, tert-butoxy group, pentyloxy group and hexyloxy group. Methoxy group or ethoxy group is more preferable. When the above alkyl group, aryl group, alkenyl group, alkynyl group, aralkyl group and alkoxy group are substituted, they may have one or two or more substituent(s). As to the substituent as such, there may be exemplified halogen atom (such as fluorine atom, chlorine atom and bromine atom), alkyl group having a number of carbon atoms of 1 to 6 (such as methyl group, ethyl group, propyl group, isopropyl group, butyl group, isobutyl group, sec-butyl group, tert-butyl group, pentyl group and hexyl group), aryl group (such as phenyl group and naphthyl group), alkenyl group (such as ethenyl group, 1-propenyl group and 2-propenyl group), alkynyl group (such as ethynyl group, 1-propynyl group and 2-propynyl group), aralkyl group (such as benzyl group and phenethyl group) and alkoxy group (such as methoxy group and ethoxy group). It is particularly preferred that $R_1$ and $R_4$ are methyl groups and $R_2$ and $R_3$ are hydrogens.

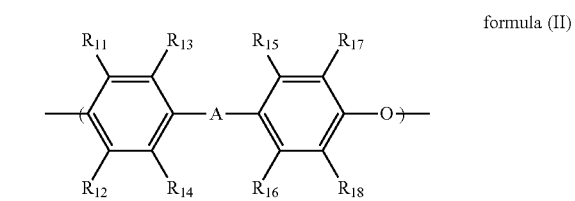

formula (II)

In the formula (II), $R_{11}$, $R_{12}$, $R_{13}$, $R_{14}$, $R_{15}$, $R_{16}$, $R_{17}$ and $R_{18}$ each independently is preferred to be a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted. Incidentally, definition of each substituent is same as above. As to the alkyl group, there may be exemplified methyl group, ethyl group, propyl group, isopropyl group, butyl group, isobutyl group, sec-butyl group, tert-butyl group, pentyl group and hexyl group. Methyl group is more preferable. It is particularly preferred that $R_{13}$, $R_{14}$, $R_{17}$ and $R_{18}$ are methyl groups, and that $R_{11}$, $R_{12}$, $R_{15}$ and $R_{16}$ are hydrogens. In addition, -A- is preferred to be a linear, branched or cyclic divalent hydrocarbon group having a number of carbon atoms of 20 or less, or oxygen. The number of carbon atoms of A is preferred to be 1 to 15, and more preferred to be 2 to 10. As to the divalent hydrocarbon group of A, there may be exemplified methylene group, ethylene group, n-propylene group, n-butylene group, cyclohexylene group and phenylene group. Among them, phenylene group is preferred. Particularly preferred one is oxygen.

The ingredient (b) may be a modified polyphenylene ether wherein a part of or all of is/are made into a functional group by ethylenic unsaturated group such as vinylbenzyl group, epoxy group, amino group, hydroxyl group, mercapto group, carboxyl group, silyl group or the like. Further, it is preferred that both terminals have hydroxyl group, epoxy group or ethylenic unsaturated group. As to the ethylenic unsaturated group, there may be exemplified an alkenyl group such as ethenyl group, allyl group, methacryl group, propenyl group, butenyl group, hexenyl group and octenyl group; a cycloalkenyl group such as cyclopentenyl group and cyclohexenyl group; and an alkenylaryl group such as vinylbenzyl group and vinylnaphthyl group. Moreover, both terminals may be the same functional group or different functional groups. In order to highly control a balance between low-dielectric tangent and reduced resin residue, it is preferred that both terminals are hydroxyl group or vinylbenzyl group and it is more preferred that all of the both terminals are hydroxyl group or vinylbenzyl group.

As to the compound having the structural unit represented by the formula (I), it is particularly preferred to be a compound of the formula (III).

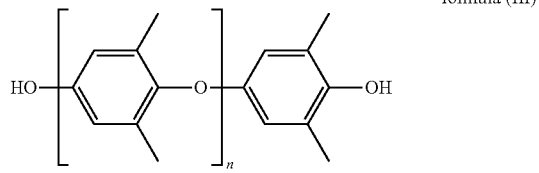

formula (III)

In the formula (III), n is preferred to be 3 or more and more preferred to be 5 or more, and is preferred to be 23 or less, more preferred to be 21 or less, and furthermore preferred to be 19 or less.

As to the compound having the structural unit represented by the formula (II), it is particularly preferred to be a compound of the formula (IV).

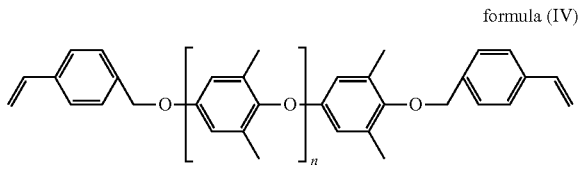

formula (IV)

In the formula (IV), n is preferred to be 2 or more and more preferred to be 4 or more, and is preferred to be 23 or less, more preferred to be 20 or less, and further preferred to be 18 or less.

It is necessary that the number-average molecular weight of the ingredient (b) is 3000 or less, and it is more preferred to be 2700 or less and further preferred to be 2500 or less. In addition, it is preferred that the number-average molecular weight of the ingredient (b) is 500 or more, and it is more preferred to be 700 or more. When the number-average molecular weight of the ingredient (b) is above the lower limit, flexibility of the resulting adhesive layer becomes good. On the contrary, when the number-average molecular weight of the ingredient (b) is below the upper limit, solubility in organic solvents becomes good.

A content of the ingredient (b) to 100 parts by mass of the ingredient (a) is preferred to be 0.05 part by mass or more. It is more preferred to be 1 part by mass or more and further preferred to be 5 parts by mass or more. When the content of the ingredient (b) is above the lower limit, excellent solder heat resistance can be achieved. In addition, the content of the ingredient (b) to 100 parts by mass of the ingredient (a) is more preferred to be 200 parts by mass or less, further preferred to be 150 parts by mass or less, furthermore preferred to be 100 parts by mass or less, and particularly preferred to be 50 parts by mass or less. When the content of the ingredient (b) is below the upper limit, excellent adhesive property and solder heat resistance can be expressed.

<Epoxy Resin (c)>

As to the epoxy resin (c) which is used in the present invention (Hereinafter, it may be also referred to just as an ingredient (c).), there is no particular limitation therefor so far as it contains glycidyl group(s) in a molecule. Preferably, it is an epoxy resin having two or more glycidyl groups in a molecule. To be more specific, there may be used at least one member selected from the group consisting of epoxy resin of biphenyl type, epoxy resin of naphthalene type, epoxy resin of bisphenol A type, epoxy resin of bisphenol F type, epoxy resin of novolak type, alicyclic epoxy resin, epoxy resin of dicyclopentadiene type, tetraglycidyl diaminodiphenylmethane, triglycidyl p-aminophenol, tetraglycidyl bisaminomethyl cyclohexanone, N,N,N',N'-tetraglycidyl-m-xylenediamine and epoxy-modified polybutadiene although there is no particular limitation therefor. Preferred one is epoxy resin of biphenyl type, epoxy resin of novolak type, epoxy resin of dicyclopentadiene type or epoxy-modified polybutadiene. More preferred one is epoxy resin of dicyclopentadiene type or epoxy-modified polybutadiene.

<Adhesive Composition>

The adhesive composition of the present invention can achieve excellent adhesive property to low-polarity resin substrates such as a liquid crystal polymer (LCP) and metal substrates, heat resistance, pot life property and electric characteristics (low-dielectric characteristics) when it contains the above three kinds of resins which are the ingredients (a) to (c) and satisfies the requirement(s) of the following (A) and/or (B). Thus, an adhesive coat (adhesive layer) prepared by applying the adhesive composition on the substrate followed by hardening can achieve excellent low-dielectric characteristics.

<Requirement (A)>

When the adhesive composition of the present invention does not contain any polycarbodiimide (d), a content of the epoxy resin (c) to 100 parts by weight of the acid-modified polyolefin (a) is preferred to be more than 20 parts by mass, more preferred to be 20.5 parts by mass or more, and further preferred to be 21 parts by mass or more. When the content of the epoxy resin (c) is above the lower limit, sufficient hardening effect can be achieved and excellent adhesive property and solder heat resistance can be expressed. The content of the epoxy resin (c) to 100 parts by weight of the acid-modified polyolefin (a) is preferred to be 60 parts by mass or less, more preferred to be 50 parts by mass or less, further preferred to be 40 parts by mass or less, and particularly preferred to be 35 parts by mass or less. When the content of the epoxy resin (c) is below the upper limit, dielectric characteristics of the adhesive composition become good. Thus, when the content of the epoxy resin (c) is within the above range, it is now possible to prepare an adhesive composition having excellent low-dielectric characteristics in addition to adhesive property, solder heat resistance and pot life property.

<Requirement (B)>

The adhesive composition of the present invention may further contain a polycarbodiimide (d) (Hereinafter, it may be also referred to just as an ingredient (d).) in addition to the three kinds of resins which are the above ingredients (a) to (c).

<Polycarbodiimide (d)>

As to the polycarbodiimide (d), there is no particular limitation so far as it has a carbodiimide group in a molecule. Preferably, it is a polycarbodiimide having two or more carbodiimide groups in a molecule. As a result of using the polycarbodiimide, the carboxyl group in the acid-modified polyolefin (a) reacts with the carbodiimide group whereby an interaction of the adhesive composition with the substrate is enhanced. Consequently, adhesive property and solder heat resistance can be improved.

When the adhesive composition of the present invention contains the polycarbodiimide (d), a content thereof to 100 parts by mass of the acid-modified polyolefin (a) is preferred to be 0.5 part by mass or more, more preferred to be 1 part by mass or more and further preferred to be 2 parts by mass or more. When the content of the polycarbodiimide (d) is above the lower limit, the interaction with the substrate is expressed and the adhesive property becomes good. The content of the polycarbodiimide (d) is preferred to be 20 parts by mass or less, more preferred to be 15 parts by mass or less and further preferred to be 10 parts by mass or less. When the content of the polycarbodiimide (d) is below the upper limit, excellent dielectric characteristics can be expressed. Thus, when the content of the polycarbodiimide (d) is within the above range, it is now possible to prepare an adhesive composition having excellent low-dielectric characteristics in addition to adhesive property, solder heat resistance and pot life property.

When the adhesive composition of the present invention contains the polycarbodiimide (d), the content of the epoxy resin (c) is not particularly limited. There is no problem even if its content to 100 parts by mass of the acid-modified polyolefin (a) is 20 parts by mass or less, and even if it is more than 20 parts by mass. When the adhesive composition of the present invention contains the polycarbodiimide (d), the content of the epoxy resin (c) to 100 parts by mass of the acid-modified polyolefin (a) is preferred to be 0.5 part by mass or more, more preferred to be 1 part by mass or more, further preferred to be 5 parts by mass or more and particularly preferred to be 10 parts by mass or more. When the content of the epoxy resin (c) is above the lower limit, sufficient hardening effect can be achieved and excellent adhesive property and solder heat resistance can be expressed. The content of the epoxy resin (c) is preferred to be 60 parts by mass or less, more preferred to be 50 parts by mass or less, further preferred to be 40 parts by mass or less, and particularly preferred to be 35 parts by mass or less. When the content of the epoxy resin (c) is below the upper limit, pot life property and dielectric characteristics of the adhesive composition become good. Thus, when the content of the epoxy resin (c) is within the above range, it is now possible to prepare an adhesive composition having excellent low-dielectric characteristics in addition to adhesive property, solder heat resistance and pot life property.

The adhesive composition of the present invention may further contain an organic solvent. The organic solvent used in the present invention is not particularly limited so far as it can dissolve the acid-modified polyolefin (a), the oligophenylene ether (b), the epoxy resin (c) and the polycarbodiimide (d). To be more specific, there may be exemplified an aromatic hydrocarbon such as benzene, toluene and xylene; an aliphatic hydrocarbon such as hexane, heptane, octane and decane; an alicyclic hydrocarbon such as cyclohexane, cyclohexene, methylcyclohexane and ethylcyclohexane; a halogenated hydrocarbon such as trichloroethylene, dichloroethylene, chlorobenzene and chloroform; an alcoholic solvent such as methanol, ethanol, isopropyl alcohol, butanol, pentanol, hexanol, propanediol and phenol; a ketone-type solvent such as acetone, methyl isobutyl ketone, methyl ethyl ketone, pentanone, hexanone, cyclohexanone, isophorone and acetophenone; cellosolve such as methyl cellosolve and ethyl cellosolve; an ester-type solvent such as methyl acetate, ethyl acetate, butyl acetate, methyl propionate and butyl formate; and a glycol ether-type solvent such as ethylene glycol mono-n-butyl ether, ethylene glycol mono-isobutyl ether, ethylene glycol mono-tert-butyl ether, diethylene glycol mono-n-butyl ether, diethylene glycol mono-isobutyl ether, triethylene glycol mono-n-butyl ether and tetraethylene glycol mono-n-butyl ether. One of them may be used solely or two or more thereof may be used jointly. Particularly in view of work environment and dryability, methylcyclohexane and toluene are preferred.

A content of the organic solvent to 100 parts by mass of the acid-modified polyolefin (a) is preferred to be within a range of 100 to 1000 parts by mass, more preferred to be within a range of 200 to 900 parts by mass and most preferred to be within a range of 300 to 800 parts by mass. When the content of the organic solvent is above the lower limit, liquid state and pot life property become good. When the content of the organic solvent is below the upper limit, that is advantageous in view of production cost and transportation cost.

In the adhesive composition of the present invention, its relative dielectric constant ($\varepsilon_c$) at the frequency of 1 GHz is preferred to be 3.0 or less, more preferred to be 2.6 or less and further preferred to be 2.3 or less. Although its lower limit is not particularly limited, it is 2.0 in a practical view. It is also preferred that the dielectric constant ($\varepsilon$) throughout the whole range of 1 to 30 GHz frequencies is 3.0 or less, preferably 2.6 or less and more preferably 2.3 or less.

In the adhesive composition of the present invention, its dielectric tangent (tan $\delta$) at the frequency of 1 GHz is preferred to be 0.02 or less, more preferred to be 0.01 or less and further preferred to be 0.008 or less. Although its lower limit is not particularly limited, it is 0.0001 in a practical view. It is also preferred that the dielectric tangent (tan $\delta$) throughout the whole range of 1 to 30 GHz frequencies is 0.02 or less, preferably 0.01 or less and more preferably 0.005 or less.

In the present invention, the relative dielectric constant ($\varepsilon_c$) and the dielectric tangent (tan $\delta$) can be measured as follows. Thus, the adhesive composition is applied to a releasing substrate so as to make a thickness after drying 25 μm followed by drying at about 130° C. for about 3 minutes. After that, it is hardened by subjecting to a heating treatment at about 140° C. for about 4 hours and the adhesive composition layer (adhesive layer) after hardening is peeled off from the releasing film. The relative dielectric constant ($\varepsilon_c$) of the adhesive composition layer after peeling off is measured at the frequency of 1 GHz. To be more specific, a metal layer is formed on both sides of the adhesive layer by a thin film method (such as vapor deposition or spattering) or by application of a conductive paste to prepare a condenser. Then, electrostatic capacity of this condenser is measured. The relative dielectric constant ($\varepsilon_c$) and the dielectric tangent (tan $\delta$) can be calculated from a thickness and an area thereof.

The adhesive composition of the present invention may further contain other ingredients if necessary within such an extent that the effect of the present invention is not deteriorated thereby. As to the specific examples of the ingredients as such, there may be exemplified a flame retardant, a tackifier, a filler and a silane coupling agent.

<Flame Retardant>

If necessary, the adhesive composition of the present invention may be compounded with a flame retardant within such an extent that it does not deteriorate the effect of the present invention. As to the flame retardant, there may be exemplified a bromine type, a phosphorus type, a nitrogen type and a metal hydroxide compound. Among them, a phosphorus-type flame retardant is preferred and there may be used a known phosphorus-type flame retardant such as a phosphoric acid ester (e.g. trimethyl phosphate, triphenyl phosphate and tricresyl phosphate), a phosphoric acid salt (e.g. aluminum phosphinate) and phosphazene. Each of them may be used solely or two or more thereof may be used in combination freely. When the flame retardant is compounded, the compounding amount to 100 parts by mass of total of the ingredients (a) to (d) is preferred to be 1 to 200 part (s) by mass, more preferred to be 5 to 150 parts by mass and most preferred to be 10 to 100 parts by mass. When the compounding amount of the flame retardant is above the lower limit, flame retarding property becomes good. When the compounding amount of the flame retardant is below the upper limit, adhesive property, heat resistance, electric characteristics, etc. do not lower.

<Tackifier>

If necessary, the adhesive composition of the present invention may be compounded with a tackifier within such an extent that it does not deteriorate the effect of the present invention. As to the tackifier, there may be exemplified polyterpene resin, rosin-type resin, aliphatic petroleum resin, alicyclic petroleum resin, copolymerized petroleum resin, styrene resin and hydrogenated petroleum resin. The tackifier is used for enhancing the adhesive strength. Each of them may be used solely or two or more thereof may be used in combination freely. When the tackifier is compounded, the compounding amount to 100 parts by mass of total of the ingredients (a) to (d) is preferred to be 1 to 200 part (s) by mass, more preferred to be 5 to 150 parts by mass and most preferred to be 10 to 100 parts by mass. When the compounding amount of the tackifier is above the lower limit, the effect of the tackifier can be achieved. When the compounding amount of the tackifier is below the upper limit, adhesive property, heat resistance, electric characteristics, etc. do not lower.

<Filler>

If necessary, the adhesive composition of the present invention may be compounded with a filler such as silica within such an extent that it does not deteriorate the effect of the present invention. When silica is compounded, heat resistance is enhanced whereby that is very preferred. As to the silica, there have been generally known hydrophobic silica and hydrophilic silica. In the present invention, a hydrophobic silica which has been treated with dimethyl dichlorosilane, hexamethyl disilazane, octylsilane or the like is better in view of imparting moisture absorption resistance. When the silica is compounded, the compounding amount of the silica to 100 parts by mass of total of the ingredients (a) to (d) is preferred to be 0.05 to 30 part (s) by mass. When the compounding amount of the silica is above the lower limit, an effect of enhancing the heat resistance can be achieved. When the compounding amount of the silica is below the upper limit, poor dispersing of silica does not happen, whereby solution viscosity is good and workability becomes good. Moreover, the adhesive property does not lower as well.

<Silane Coupling Agent>

If necessary, the adhesive composition of the present invention may be compounded with a silane coupling agent such as silica within such an extent that it does not deteriorate the effect of the present invention. When the silane coupling agent is compounded, adhesive property to metals and heat resistance are enhanced whereby that is very preferred. Although the silane coupling agent is not particularly limited, there may be exemplified the agents having an unsaturated group, a glycidyl group, an amino group, etc. Among them, a silane coupling agent having a glycidyl group such as γ-glycidoxypropyl trimethoxysilane, β-(3,4-epoxycyclohexyl) ethyl trimethoxysilane and β-(3,4-epoxycyclohexyl) ethyl triethoxysilane is more preferred in view of heat resistance. When the silane coupling agent is compounded, the compounding amount of the silane coupling agent to 100 parts by mass of total of the ingredients (a) to (d) is preferred to be 0.5 to 20 part (s) by mass. When the compounding amount of the silane coupling agent is above 0.5 part by mass, heat resistance becomes good. On the other hand, when the compounding amount of the silane coupling agent is below 20 parts by mass, heat resistance and adhesive property become good.

<Laminate>

The laminate of the present invention is such a laminate that is prepared by lamination of a substrate with an adhesive composition (a two-layered laminate of substrate/adhesive layer) or is prepared by further lamination of the above two-layered laminate with a substrate (a three-layered laminate of substrate/adhesive layer/substrate). Hereinabove, the adhesive layer is a layer of an adhesive composition formed by applying the adhesive composition of the present invention to a substrate followed by drying. The laminate of the present invention can be prepared by obtaining a laminate by means of application of the adhesive composition of the present invention to various substrates followed by drying according to a conventional method and also by further lamination of other substrate (s) thereto.

<Substrate>

In the present invention, a substrate is not particularly limited so far as an adhesive composition of the present invention is applied thereon followed by drying whereby an adhesive layer can be formed. There may be exemplified a resin substrate (such as filmy resin), a metal substrate (such as metal plate and metal foil) and paper.

As to the resin substrate, there may be exemplified polyester resin, polyamide resin, polyimide resin, polyamideimide resin, liquid crystal polymer, polyphenylene sulfide, syndiotactic polystyrene, polyolefin resin and fluorine resin. A preferred one is filmy resin. (Hereinafter, it will also be referred to as a substrate film layer.)

As to the metal substrate, any of the conventionally known conductive materials useable for circuit substrates can be used. As to a raw material therefor, there may be exemplified various metals such as SUS, copper, aluminum, iron, steel, zinc and nickel; alloys and plated ones of each of them; and metal being processed with other metal such as zinc and chromium compound. Preferred one is a metal foil and more preferred one is a copper foil. Although a thickness of the metal foil is not particularly limited, it is preferred to be 1 μm or more, more preferred to be 3 μm or more and further preferred to be 10 μm or more. In addition, it is preferred to be 50 μm or less, more preferred to be 30 μm or less and further preferred to be 20 μm or less. When the thickness is too thin, sufficient electric property of the circuit may be hardly achieved while, when it is too thick, processing efficiency, etc. upon preparing the circuit may lower. The metal foil is usually provided in a roll-like shape. There is no particular limitation for the shape of the metal foil used for preparing the printed-circuit board of the present invention. When a metal foil in a ribbon-like shape is used, there is no particular limitation for its length. Although its width is not particularly limited as well, it is preferred to be about 250 to 500 cm.

As to the paper, there may be exemplified high-quality paper, kraft paper, rolled paper and glassine paper. As to a composite material, there may be exemplified glass epoxy.

In view of adhesive force to the adhesive composition and durability, preferable substrate is polyester resin, polyamide resin, polyimide resin, polyamideimide resin, liquid crystal polymer, polyphenylene sulfide, syndiotactic polystyrene, polyolefin resin, fluorine resin, SUS steel sheet, copper foil, aluminum foil or glass epoxy.

<Adhesive Sheet>

In the present invention, the adhesive sheet is a sheet which is prepared by laminating the laminate with a releasing substrate via an adhesive composition. As to its specific constitution embodiment, there may be exemplified laminate/adhesive layer/releasing substrate, or releasing substrate/adhesive layer/laminate/adhesive layer/releasing substrate. The layered releasing substrate functions as a protective layer for the substrate. In addition, when the releasing substrate is used, it is possible to remove the releasing substrate from the adhesive sheet and further transfer the adhesive layer to other substrate.

When the adhesive composition of the present invention is applied to various laminates followed by drying according to a conventional method, the adhesive sheet of the present invention can be prepared. In addition, when the releasing substrate is applied to the adhesive layer after the drying, winding up becomes possible without causing any offset to the substrate whereby the operability is excellent. Moreover, the adhesive layer is also protected whereby the preservability is excellent and the use is also easy. In addition, when another releasing substrate is applied upon necessity after the adhesive composition is applied to one releasing substrate followed by drying, it is also possible that the adhesive layer itself can be transferred to another substrate.

<Releasing Substrate>

Although the releasing substrate is not particularly limited, there may be exemplified a thing prepared by applying a filler (such as clay, polyethylene and polypropylene) on both sides of paper (such as high-quality paper, kraft paper, rolled paper and glassine paper) so as to form a layer, and then applying a releasing agent of silicone type, fluorine type or alkyd type onto each of the above layer. There may be also exemplified a thing prepared by applying the above releasing agent on a single olefin film (such as polyethylene, polypropylene, a copolymer of ethylene with α-olefin and a copolymer of propylene with α-olefin) or on a film of polyethylene terephthalate, etc. Due to the releasing force between the releasing substrate and the adhesive layer and due to the bad affection of silicone on electric characteristics, it is preferred to use a thing prepared by subjecting both sides of the high-quality paper to a filling treatment using polypropylene, and then applying an alkyd-type releasing agent thereon, or to use a thing prepared by applying an alkyd-type releasing agent on polyethylene terephthalate.

In the present invention, although there is no particular limitation for the means of coating the adhesive composition on the substrate, there may be exemplified a comma coater and a reverse roll coater. Alternatively, it is also possible that, if necessary, an adhesive layer is formed onto a rolled copper foil being a constituting material for printed circuit board or onto a polyimide film, either directly or by a transfer method. Although a thickness of the adhesive layer after drying may be appropriately changed upon necessity, it is preferred to be within a range of 5 to 200 μm. When the thickness of the adhesive film is less than 5 μm, adhesive strength may be insufficient. When it is 200 μm or more, drying is insufficient and residual solvent becomes abundant whereby swell may be resulted upon pressing in the production of printed-circuit board. Although the drying condition is not particularly limited, a content of the residual solvent after drying is preferred to be 1% by mass or less. When it is more than 1% by mass, the residual solvent bubbles upon pressing the printed-circuit board, which results in the swell.

<Printed-Circuit Board>

The "printed-circuit board" in the present invention contains, as a constituting element, a laminate which is formed from a metal foil forming a conductive circuit and from a resin substrate. The printed-circuit board is prepared by a conventionally known method such as, for example, a subtractive method using a metal-lined laminate. A so-called flexible printed circuit (FPC), flat cable, circuit board for tape automated bonding (TAB), etc. wherein a conductive circuit formed by metal foil is coated, if necessary, by a cover film, a screen printing ink, etc. either partially or wholly are generically called "printed-circuit board".

The printed-circuit board of the present invention can adopt any laminated constitution which can be adopted as a printed-circuit board. For example, a printed-circuit board constituted from four layers of a substrate film layer, a metal foil layer, an adhesive layer and a cover film layer can be used. It is also possible to use a printed-circuit board which is constituted from, for example, five layers of a substrate film layer, an adhesive layer, a metal foil layer, an adhesive layer and a cover film layer.

If necessary, it is also possible to adopt a constitution wherein two or three or more of the above printed-circuit boards are laminated.

The adhesive composition of the present invention can be advantageously used in each adhesive layer of the printed-circuit board. Particularly when the adhesive composition of the present invention is used as an adhesive, it exhibits high adhesive property not only to the conventional polyimide, polyester film and copper foil constituting a printed-circuit board but also to a lowly polar resin substrate such as LCP whereby solder reflow resistance can be achieved. Moreover, the adhesive layer itself is excellent in low-dielectric characteristics. Therefore, the adhesive composition of the present invention is advantageous as an adhesive composition to be used for a coverlay film, a laminate, a copper foil with resin and a bonding sheet.

As to the substrate film in the printed-circuit board of the present invention, any resin film which has been used conventionally as a substrate for a printed-circuit board can be used. As to the resin of the substrate film, there may be exemplified polyester resin, polyamide resin, polyimide resin, polyamideimide resin, liquid crystal polymer, polyphenylene sulfide, syndiotactic polystyrene, polyolefin resin and fluorine resin. Particularly, the adhesive composition of the present invention exhibits excellent adhesive property to a lowly polar substrate such as liquid crystal polymer, polyphenylene sulfide, syndiotactic polystyrene and polyolefin resin.

<Cover Film>

As to the cover film, any insulating film which has been known as an insulating film for a printed-circuit board can be used. For example, it is possible to use a film prepared from various polymers such as polyimide, polyester, polyphenylene sulfide, polyether sulfone, polyether ether ketone, aramid, polycarbonate, polyarylate, polyamideimide, liquid crystal polymer, syndiotactic polystyrene and polyolefin-type resin. Preferable one is polyimide film or liquid crystal polymer.

The printed-circuit board of the present invention can be prepared by any conventionally known process except that the above-mentioned material for each layer is used.

In a preferred embodiment, one semifinished product is prepared wherein an adhesive layer is laminated on a cover film layer (Hereinafter, it will be referred to as "a semifinished product in a cover film side".). On the other hand, another semifinished product is prepared wherein a metal foil layer is laminated on a substrate film layer so as to form a desired circuit pattern (Hereinafter, it will be referred to as a "two-layered semifinished product in a substrate film side".) or still another semifinished product is prepared wherein an adhesive layer is laminated on a substrate film layer and a metal foil layer is laminated thereon so as to form a desired circuit pattern (Hereinafter, it will be referred to as a "three-layered semifinished product in a substrate film side".). (Hereinafter, a general name "semifinished product in a substrate film side" will be given to both of the "two-layered semifinished product in a substrate film side" and the "three-layered semifinished product in a substrate film side".) When the "semifinished product in a cover film side" and the "semifinished product in a substrate film side" prepared as such are laminated, a four- or five-layered printed-circuit board can be prepared.

The "semifinished product in a substrate film side" is prepared by a preparation method comprising, for example, (A) a step wherein a resin solution which will form a substrate film is applied to the metal foil and the resulting coat is subjected to a primary drying and (B) a step wherein a laminate of the metal foil with the primarily dried coat obtained in the step (A) is subjected to a heating treatment and drying (Hereinafter, it will be referred to as a "heating/solvent-removing step".).

In order to form a circuit in the metal foil layer, a conventionally known method may be used. Either an active method or a subtractive method may be used. Preferable one is subtractive method.

The resulting "semifinished product in a substrate film side" may be used just as it is for lamination to the "semifinished product in a cover film side" or, after a releasing film is laminated thereto followed by storing, it may be used for lamination to the "semifinished product in a covering film side".

The "semifinished product in a covering film side" is prepared, for example, by applying an adhesive to a cover film. If necessary, a crosslinking reaction may be conducted in the applied adhesive. In a preferred embodiment, the adhesive layer is semi-hardened.

The resulting "semifinished product in a cover film side" may be used just as it is for lamination to the "semifinished product in a substrate film side" or, after a releasing film is laminated thereto followed by storing, it may be used for lamination to the "semifinished product in a substrate film side".

Each of the "semifinished product in a substrate film side" and the "semifinished product in a cover film side" is stored, for example, in a form of roll, and then they are laminated to each other to prepare a printed-circuit board. As to the lamination method, any method can be used. For example, the lamination can be done using a press or a roll. It is also possible that the lamination of them is done together with heating by a method, for example, using a heating press or a heating roll device.

It is advantageous that a "semifinished product in a reinforcing material side" is prepared by applying an adhesive to a reinforcing material in case of, for example, a polyimide film which is soft and can be wound up. Further, in case of a reinforcing plate which is hard and cannot be wound up such as a metal plate (e.g. SUS and aluminum plate) and a glass fiber plate being hardened with epoxy resin, it is advantageous to prepare the "semifinished product in a reinforcing material side" by such a means that an adhesive previously applied to a releasing substrate is transferred and applied. In addition, if necessary, a crosslinking reaction may be conducted in the applied adhesive. In a preferred embodiment, the adhesive layer is semi-hardened.

The resulting "semifinished product in a reinforcing material side" may be used just as it is for lamination to a back side of the printed-circuit board or, after a releasing film is laminated thereto followed by storing, it may be used for lamination to the "semifinished product in a substrate film side".

Any and each of the "semifinished product in a substrate film side", the "semifinished product in a cover film side" and the "semifinished product in a reinforcing material side" is a laminate for a printed-circuit board in accordance with the present invention.

EXAMPLES

Hereinafter, the present invention will be illustrated in more detail by referring to Examples. However, the present invention shall not be limited to and by the Examples. The term reading just "part(s)" in Examples and comparative examples stands for part(s) by mass.

(Methods for Evaluating Physical Properties)

Acid Value of Ingredient (a): Acid-Modified Polyolefin

In the present invention, the acid value (equivalent/$10^6$ g) was measured by dissolving an acid-modified polyolefin in toluene followed by titrating in a methanolic solution of sodium methoxide, using phenolphthalein as an indicator. The acid value was expressed as an equivalent in 1 ton of the resin (equivalent/$10^6$ g).

Number-Average Molecular Weight (Mn)

In the present invention, the number-average molecular weight is a value measured by a gel permeation chromatography (Hereunder, it is called "GPC".) manufactured by Shimadzu under the following conditions.

Standard substance: polystyrene resin;
Mobile phase: tetrahydrofuran;
Column: Shodex KF-802+KF-804L+KF-806L;
Column temperature: 30° C.;
Flow rate: 1.0 ml/minute;
Detector: RI detector.

Measurement of Melting Point and Heat of Melting

In the present invention, melting point and heat of melting are values calculated from a top temperature and an area of a melting peak. Specifically, the resin is heated at a rate of 20° C./minute using a differential scanning calorimeter (Hereinafter, it will be referred to as "DSC"; Q-2000 manufactured by T. A. Instruments Japan.) so as to melt. Then, the melt is cooled and returned to the resin. Then, the resin is again heated so as to melt. The melting peak is taken at that time.

(1) Peel Strength (Adhesive Property)

An adhesive composition which will be mentioned later was applied to a polyimide film of 12.5 μm thickness (Apical [registered trademark] manufactured by Kaneka) or to a rolled copper foil of 18 μm thickness (BHY Series manufactured by JX Kinzoku) so as to make a thickness after drying 25 μm followed by drying at 130° C. for 3 minutes to give an adhesive film. The adhesive film prepared as such (B stage product) was laminated to a polyimide film of 12.5 μm thickness or to a rolled copper foil of 18 μm thickness. The lamination was conducted in such a manner that a glossy side of the rolled copper foil was arranged to contact the adhesive layer, and adhered by pressing for 30 seconds at 160° C. under the pressure of 40 kgf/cm². After that, a heating treatment at 140° C. was conducted for 4 hours to harden whereupon a sample for the evaluation of peel strength was prepared. This sample was used for conducting a 90° peel test at 25° C. and with a tensile speed for film pulling of 50 mm/minute whereupon a peel strength was measured. This test shows the adhesive strength at ambient temperature.

<Evaluation Criteria>
- ⊙⊙: 1.0 N/mm or more
- ⊙: 0.8 N/mm or more and less than 1.0 N/mm
- Δ: 0.5 N/mm or more and less than 0.8 N/mm
- x: less than 0.5 N/mm (2) Solder Heat Resistance A sample was prepared by the same method as the above (1). A sample piece in 2.0 cm×2.0 cm was subjected to an aging treatment at 23° C. for two days. After that, it was floated for 10 seconds in a solder bath melted at 280° C. The sample after the floating was checked for appearance changes such as swell.

<Evaluation Criteria>
- ⊙⊙: No swell was noted.
- ⊙: Partial swell was noted.
- Δ: Many swells were noted.
- x: Swells and color change were noted.

(3) Relative Dielectric Constant ($\varepsilon_c$) and Dielectric Tangent (Tan δ)

An adhesive composition which will be mentioned later was applied to a glossy surface of an electrolyzed copper foil of 35 μm thickness so as to make a thickness after drying and hardening 25 μm followed by drying at 130° C. for 3 minutes. After that, it was hardened by subjecting to a heating treatment at 140° C. for 4 hours to give a copper-lined laminate for the test. A conductive silver paste of an evaporation-to-dryness type was applied in a circle of 50 mm diameter by means of screen printing on the hardened adhesive composition side of the resulting copper-lined laminate for the test followed by drying and hardening at 120° C. for 30 minutes. Further, a lead wire of 30 mm length was adhered using a conductive adhesive to a center of the circle formed by the conductive silver paste to give a parallel flat-plate condenser. Electrostatic capacity (Cap) and loss factor (D) (dielectric tangent) of the resulting parallel flat-plate condenser were measured by a precision LCR meter HP-4284A under conditions of 22° C. and 1 GHz frequency. The relative dielectric constant ($\varepsilon_c$) was calculated from the resulting data according to the following formula.

$$\varepsilon_c = (Cap \times d)/(S \times \varepsilon_0)$$

In this formula,
Cap: electrostatic capacity [F]
d: thickness of the dielectric layer=$25 \times 10^{-6}$ [m]
S: area of the dielectric to be measured=$\pi \times (25 \times 10^{-3})^2$
$\varepsilon_0$: dielectric constant in vacuo=$8.854 \times 10^{-12}$ The resulting relative dielectric constant and dielectric tangent were evaluated as follows.

<Evaluation Criteria for Relative Dielectric Constant>
- ⊙⊙: 2.3 or less
- ⊙: more than 2.3 and not more than 2.6
- Δ: more than 2.6 and not more than 3.0
- x: more than 3.0

<Evaluation Criteria for Dielectric Tangent>
- ⊙⊙: 0.008 or less
- ⊙: more than 0.008 and not more than 0.01
- Δ: more than 0.01 and not more than 0.02
- x: more than 0.02

(4) Pot Life Property

The ingredients (a) to (d) and a mixed solvent of methylcyclohexane and toluene (methylcyclohexane/toluene=80/20 (v/v)) were compounded so as to make a solid concentration 20% by mass whereupon a resin solution (varnish) was prepared. Stability of the varnish immediately after the compounding or after a predetermined time from the compounding was evaluated as a pot life property. When the pot life property is good, it means that a viscosity rise of the varnish is small and the varnish can be preserved for a long period. When the pot life property is poor, it means that the viscosity of the varnish rises (thickens) resulting in a gelling phenomenon in the worst case, application to the substrate is difficult and preservation of the varnish for a long period is not possible.

For the varnish prepared according to the ratios shown in Tables 1 and 2, the dispersion viscosity at 25° C. was measured using a Brookfield viscometer whereupon the initial dispersion viscosity (ηB0) was determined. After that, the varnish was stored at 25° C. for 7 days, and then the dispersion viscosity ηB at 25° C. was measured. The varnish viscosity was calculated by the following formula and evaluated as follows.

Solution Viscosity Ratio=Solution Viscosity (ηB)/Solution Viscosity (ηB0)

<Evaluation Criteria>
- ⊙⊙: 0.5 or more and less than 1.5
- ⊙: 1.5 or more and less than 2.0
- Δ: 2.0 or more and less than 3.0
- x: 3.0 or more; or viscosity measurement was impossible due to the change to pudding Example 1

CO-1 in 80 parts by mass, OPE-2St 1200 in 20 parts by mass, polycarbodiimide V-09 GB in 5 parts by mass, epoxy resin HP-7200 in 17 parts by mass and organic solvent (methylcyclohexane/toluene=80/20 (v/v)) in 488 parts by mass (20% by mass in terms of solid concentration) were compounded to give an adhesive composition. Compounding amounts, adhesive strength, solder heat resistance and electric characteristics of the adhesive composition are shown in Table 1.

Examples 2 to 20

Examples 2 to 20 were conducted by the same method as in Example 1 except that the changes were made as shown in Table 1 to prepare adhesive compositions. Adhesive strength, solder heat resistance and electric characteristics of those adhesive compositions are shown in Table 1. Incidentally, the organic solvent (methylcyclohexane/toluene=80/20 (v/v)) was adjusted so as to make the solid concentration 20% by mass.

TABLE 1

|  |  | Example 1 | Example 2 | Example 3 | Example 4 | Example 5 |
|---|---|---|---|---|---|---|
| acid-modified polyolefin (a) (parts by mass) | CO-1 | 80 |  |  |  |  |
|  | CO-2 |  |  |  |  |  |
|  | CO-3 |  |  | 80 | 80 | 80 | 40 |
|  | CO-4 |  |  |  |  |  |

TABLE 1-continued

|  |  |  |  |  |  |
|---|---|---|---|---|---|
| oligo-phenylene ether (b) (parts by mass) | OPE-2St 1200 | 20 |  | 20 |  |  |
|  | OPE-2St 2200 |  | 20 |  | 20 | 60 |
|  | SA90 |  |  |  | 20 |  |
|  | PPO powder |  |  |  |  |  |
| epoxy resin (c) (parts by mass) | HP-7200 | 17 | 17 | 17 | 17 |  |
|  | HP-7200H |  |  |  |  |  |
|  | JP-100 |  |  |  |  | 17 |
| polycarbodiimide (d) (parts by mass) | V-09GB | 5 | 5 | 5 | 5 | 5 |
|  | V-03 |  |  |  |  |  |
| adhesive strength (PI/Ad/PI) | evaluation | Δ | Δ | ○ | ○ | Δ |
| solder heat resistance (PI/Ad/PI) | evaluation | ○○ | ○○ | ○○ | ○○ | ○○ |
| adhesive strength (PI/Ad/Cu) | evaluation | Δ | Δ | ○ | ○ | Δ |
| solder heat resistance (PI/Ad/Cu) | evaluation | Δ | ○ | ○○ | Δ | Δ |
| adhesive strength (Cu/Ad/Cu) | evaluation | Δ | Δ | ○ | ○ | Δ |
| solder heat resistance (Cu/Ad/Cu) | evaluation | ○○ | ○○ | ○○ | ○ | ○ |
| electric characteristics (dielectric characteristics) | relative dielectric constant | ○ | ○○ | ○○ | ○ | Δ |
|  | dielectric tangent | ○ | ○○ | ○○ | ○ | ○○ |
| pot life | initial | ○ | ○○ | ○○ | ○ | Δ |
|  | 25° C. × 1 week later | ○ | ○○ | ○○ | ○ | ○○ |

|  |  | Example 6 | Example 7 | Example 8 | Example 9 | Example 10 |
|---|---|---|---|---|---|---|
| acid-modified polyolefin (a) (parts by mass) | CO-1 |  |  |  |  |  |
|  | CO-2 |  |  | 80 |  |  |
|  | CO-3 | 70 |  |  | 80 | 80 |
|  | CO-4 |  |  | 80 |  |  |
| oligo-phenylene ether (b) (parts by mass) | OPE-2St 1200 |  |  |  |  |  |
|  | OPE-2St 2200 | 30 | 20 | 20 | 20 | 20 |
|  | SA90 |  |  |  |  |  |
|  | PPO powder |  |  |  |  |  |
| epoxy resin (c) (parts by mass) | HP-7200 | 16 | 10 | 10 | 34 |  |
|  | HP-7200H |  |  |  |  | 17 |
|  | JP-100 |  |  |  |  |  |
| polycarbodiimide (d) (parts by mass) | V-09GB | 5 | 5 | 5 | 5 | 5 |
|  | V-03 |  |  |  |  |  |
| adhesive strength (PI/Ad/PI) | evaluation | ○○ | ○○ | Δ | Δ | Δ |
| solder heat resistance (PI/Ad/PI) | evaluation | ○○ | ○○ | ○○ | ○○ | ○○ |
| adhesive strength (PI/Ad/Cu) | evaluation | ○○ | ○○ | Δ | Δ | Δ |
| solder heat resistance (PI/Ad/Cu) | evaluation | ○○ | ○○ | Δ | Δ | Δ |
| adhesive strength (Cu/Ad/Cu) | evaluation | ○○ | ○○ | Δ | Δ | Δ |
| solder heat resistance (Cu/Ad/Cu) | evaluation | ○○ | ○○ | Δ | Δ | Δ |
| electric characteristics (dielectric characteristics) | relative dielectric constant | Δ | ○○ | ○ | ○ | ○ |
|  | dielectric tangent | ○ | ○○ | ○ | ○ | ○ |
| pot life | initial | Δ | ○○ | ○ | ○ | ○ |
|  | 25° C. × 1 week later | ○ | ○○ | ○ | ○ | ○ |

|  |  | Example 11 | Example 12 | Example 13 | Example 14 | Example 15 |
|---|---|---|---|---|---|---|
| acid-modified polyolefin (a) (parts by mass) | CO-1 |  |  |  |  |  |
|  | CO-2 |  |  |  |  |  |
|  | CO-3 | 80 | 80 | 80 | 80 | 80 |
|  | CO-4 |  |  |  |  |  |
| oligo-phenylene ether (b) (parts by mass) | OPE-2St 1200 |  |  |  |  |  |
|  | OPE-2St 2200 | 20 | 20 | 20 | 20 | 20 |
|  | SA90 |  |  |  |  |  |
|  | PPO powder |  |  |  |  |  |
| epoxy resin (c) (parts by mass) | HP-7200 |  |  |  |  |  |
|  | HP-7200H | 22 | 17 | 2 | 17 | 17 |
|  | JP-100 |  |  |  |  |  |
| polycarbodiimide (d) (parts by mass) | V-09GB | 5 |  | 0.9 | 5 | 2 |
|  | V-03 |  | 5 |  |  |  |
| adhesive strength (PI/Ad/PI) | evaluation | Δ | Δ | Δ | Δ | Δ |

TABLE 1-continued

|  |  | | | | | |
|---|---|---|---|---|---|---|
| solder heat resistance (PI/Ad/PI) | evaluation | ○ | ○○ | ○○ | ○○ | ○○ |
| adhesive strength (PI/Ad/Cu) | evaluation | Δ | Δ | Δ | Δ | Δ |
| solder heat resistance (PI/Ad/Cu) | evaluation | Δ | Δ | Δ | Δ | Δ |
| adhesive strength (Cu/Ad/Cu) | evaluation | Δ | Δ | Δ | Δ | Δ |
| solder heat resistance (Cu/Ad/Cu) | evaluation | Δ | Δ | Δ | Δ | Δ |
| electric characteristics (dielectric characteristics) | relative dielectric constant | ○ | ○ | ○ | ○ | ○ |
|  | dielectric tangent | ○ | ○ | ○ | ○ | ○ |
| pot life | initial | ○ | ○ | ○ | ○ | ○ |
|  | 25° C. × 1 week later | ○ | ○ | ○ | ○ | ○ |

|  |  | Example 16 | Example 17 | Example 18 | Example 19 | Example 20 |
|---|---|---|---|---|---|---|
| acid-modified polyolefin (a) (parts by mass) | CO-1 | | | | | |
|  | CO-2 | | | | | |
|  | CO-3 | 80 | 80 | 80 | 80 | 80 |
|  | CO-4 | | | | | |
| oligo-phenylene ether (b) (parts by mass) | OPE-2St 1200 | | | | | |
|  | OPE-2St 2200 | 20 | 20 | 20 | 20 | 20 |
|  | SA90 | | | | | |
|  | PPO powder | | | | | |
| epoxy resin (c) (parts by mass) | HP-7200 | 17 | 62 | 17 | 22 | |
|  | HP-7200H | | | | | 17 |
|  | JP-100 | | | | | |
| polycarbodiimide (d) (parts by mass) | V-09GB | | 5 | 20 | | |
|  | V-03 | | | | | |
| adhesive strength (PI/Ad/PI) | evaluation | ○ | ○ | ○○ | ○ | ○ |
| solder heat resistance (PI/Ad/PI) | evaluation | Δ | ○○ | Δ | ○ | Δ |
| adhesive strength (PI/Ad/Cu) | evaluation | Δ | ○ | ○○ | Δ | ○ |
| solder heat resistance (PI/Ad/Cu) | evaluation | Δ | ○○ | Δ | ○ | ○ |
| adhesive strength (Cu/Ad/Cu) | evaluation | ○ | ○ | ○○ | ○ | ○ |
| solder heat resistance (Cu/Ad/Cu) | evaluation | ○○ | ○○ | Δ | ○○ | ○○ |
| electric characteristics (dielectric characteristics) | relative dielectric constant | ○○ | x | x | ○ | ○○ |
|  | dielectric tangent | ○○ | x | x | ○ | ○○ |
| pot life | initial | ○ | ○ | ○ | ○ | ○ |
|  | 25° C. × 1 week later | Δ | Δ | Δ | Δ | Δ |

Comparative Examples 1 to 5

Comparative Examples 1 to 5 were conducted by the same method as in Example 1 except that the changes were made as shown in Table 2 to prepare adhesive compositions. Adhesive strength, solder heat resistance and electric characteristics of those adhesive compositions are shown in Table 2.

TABLE 2

|  |  | Comparative Example 1 | Comparative Example 2 | Comparative Example 3 | Comparative Example 4 | Comparative Example 5 |
|---|---|---|---|---|---|---|
| acid-modified polyolefin (a) (parts by mass) | CO-1 | | | | | |
|  | CO-2 | | | | | |
|  | CO-3 | 100 | | 100 | 80 | 80 |
|  | CO-4 | | | | | |
| oligo-phenylene ether (b) (parts by mass) | OPE-2St 1200 | | | | | |
|  | OPE-2St 2200 | | 100 | 20 | | 20 |
|  | SA90 | | | | | |
|  | PPO powder | | | | 20 | |
| epoxy resin (c) (parts by mass) | HP-7200 | 17 | 17 | | 17 | 5 |
|  | HP-7200H | | | | | |
|  | JP-100 | | | | | |
| polycarbodiimide (d) (parts by mass) | V-09GB | 5 | 5 | 5 | 5 | |
|  | V-03 | | | | | |
| adhesive strength (PI/Ad/PI) | evaluation | ○○ | x | Δ | measurement was impossible due to poor solubility | Δ |
| solder heat resistance (PI/Ad/PI) | evaluation | Δ | Δ | x | | x |

TABLE 2-continued

| | | Comparative Example 1 | Comparative Example 2 | Comparative Example 3 | Comparative Example 4 | Comparative Example 5 |
|---|---|---|---|---|---|---|
| adhesive strength (PI/Ad/Cu) | evaluation | ◯◯ | x | Δ | | Δ |
| solder heat resistance (PI/Ad/Cu) | evaluation | x | Δ | x | | x |
| adhesive strength (Cu/Ad/Cu) | evaluation | ◯◯ | x | Δ | | Δ |
| solder heat resistance (Cu/Ad/Cu) | evaluation | x | ◯ | x | | x |
| electric characteristics (dielectric characteristics) | relative dielectric constant | ◯◯ | ◯ | ◯◯ | | ◯◯ |
| | dielectric tangent | ◯◯ | ◯ | ◯◯ | | ◯◯ |
| pot life | initial | ◯ | ◯ | ◯ | | ◯ |
| | 25° C. × 1 week later | ◯ | ◯ | ◯ | | ◯ |

Acid-modified polyolefin (a), oligo-phenylene ether (b), epoxy resin (c) and polycarbodiimide (d) used in Table 1 and 2 are as follows.

(Oligo-Phenylene Ether (b))

Oligophenylene ether modified with styrene: OPE-2St 1200 (manufactured by Mitsubishi Gas Chemical; a compound having a structure of the formula (4) wherein Mn is 1000)

Oligophenylene ether modified with styrene: OPE-2St 2200 (manufactured by Mitsubishi Gas Chemical; a compound having a structure of the formula (4) wherein Mn is 2000)

Oligophenylene ether: SA90 (manufactured by SABIC; a compound having a structure of the formula (3) wherein Mn is 1800)

Oligophenylene ether: PPO resin powder (manufactured by SABIC; a compound having a structure of the formula (3) wherein Mn is 20000)

(Epoxy Resin (c))

Dicyclopentadiene-type epoxy resin: HP-7200 (manufactured by DIC; epoxy resin equivalent: 259 g/eq)

Dicyclopentadiene-type epoxy resin: HP-7200H (manufactured by DIC; epoxy resin equivalent: 278 g/eq)

Epoxy-modified polybutadiene resin: JP-100 (manufactured by Nippon Soda)

(Polycarbodiimide (d))

Polycarbodiimide resin: V-09 GB (manufactured by Nisshinbo Chemical; carbodiimide equivalent: 216 g/eq)

Polycarbodiimide resin: V-03 (manufactured by Nisshinbo Chemical; carbodiimide equivalent: 209 g/eq)

(Acid-Modified Polyolefin (a))

Preparation Example 1

To a one-liter autoclave were added 100 parts by mass of a propylene-butene copolymer ("Tafmer" [registered trademark] XM7080 manufactured by Mitsui Chemical), 150 parts by mass of toluene, 19 parts by mass of maleic anhydride and 6 parts by mass of di-tert-butyl peroxide. After raising the temperature up to 140° C., stirring was conducted for another 3 hours. After that, the resulting reaction solution was cooled. Then the reaction solution was poured over a container in which a large amount of methyl ethyl ketone was present to separate out the resin. After that, a liquid containing the resin was subjected to centrifugal separation so that an acid-modified propylene-butene copolymer to which maleic anhydride was graft-polymerized was separated from (poly)maleic anhydride and low-molecular substances followed by purifying. After that, it was dried in vacuo at 70° C. for 5 hours to give a propylene-butene copolymer modified with maleic anhydride (CO-1; acid value: 19 mg KOH/g; number-average molecular weight: 25,000; Tm: 80° C.; ΔH: 35 J/g).

Preparation Example 2

A propylene-butene copolymer modified with maleic anhydride (CO-2; acid value: 14 mg KOH/g; number-average molecular weight: 30,000; Tm: 78° C.; ΔH: 25 J/g) was prepared by the same method as in Preparation Example 1 except that the charging amount of maleic anhydride was changed to 14 parts by mass.

Preparation Example 3

A propylene-butene copolymer modified with maleic anhydride (CO-3; acid value: 11 mg KOH/g; number-average molecular weight: 33,000; Tm: 80° C.; ΔH: 25 J/g) was prepared by the same method as in Preparation Example 1 except that the charging amount of maleic anhydride was changed to 11 parts by mass.

Preparation Example 4

A propylene-butene copolymer modified with maleic anhydride (CO-4; acid value: 7 mg KOH/g; number-average molecular weight: 35,000; Tm: 82° C.; ΔH: 25 J/g) was prepared by the same method as in Preparation Example 1 except that the charging amount of maleic anhydride was changed to 6 parts by mass.

As will be apparent from Tables 1 and 2, pot life of the main ingredient is excellent in Examples 1 to 20. In addition, as an adhesive, it exhibits excellent adhesive property and solder heat resistance in terms of adhesion of polyimide (PI) to copper foil, between copper foils and between PI. Moreover, electric characteristics of the adhesive compositions of Examples 1 to 16, 19 and 20 are low and good in both terms of dielectric constant and dielectric tangent. In Examples 17 and 18, the compounding amount of the epoxy resin (c) and the compounding amount of the polycarbodiimide (d) each is large whereby the electric characteristics are inferior although adhesive property, solder heat resistance and pot life property are good. On the contrary, in Comparative Example 1, the solder heat resistance is low since the oligo-phenylene ether (b) is not contained therein. In Comparative Example 2, the adhesive property is inferior since the acid-modified polyolefin (a) is not contained therein. In Comparative Example 3, the solder heat resistance is low since the epoxy resin (c) is not contained therein. In Comparative Example 4, the product was not soluble in organic solvent and a resin solution (varnish) could not be prepared since the number-average molecular weight of the oligo-phenylene ether (b) is large. In Comparative Example 5, the solder heat resistance is low since the compounding amount of the epoxy resin (c) is small and the polycarbodiimide (d) is not contained therein.

INDUSTRIAL APPLICABILITY

The adhesive composition of the present invention exhibits high adhesive property not only to the conventional polyimide and polyethylene terephthalate film but also to a metal substrate such as copper foil, can achieve high solder heat resistance and is also excellent in pot life property. In addition, the adhesive composition of the present invention can achieve excellent low-dielectric characteristics by adjusting the compounding amounts of epoxy resin and polycarbodiimide. Starting from the adhesive composition of the present invention, it is possible to prepare an adhesive sheet and a laminate which is adhered using the same. Due to the above characteristics, the adhesive composition of the present invention is useful in the application as a flexible printed-circuit board or particularly in the application as an FPC wherein low-dielectric characteristics (low-dielectric constant and low-dielectric tangent) in a high frequency region are demanded.

The invention claimed is:

1. An adhesive composition of varnish type comprising an acid-modified polyolefin (a), an oligo-phenylene ether (b) having a number-average molecular weight of 3000 or less, an epoxy resin (c), and an organic solvent, wherein the adhesive composition comprises 0.05 to 100 part(s) by mass of the oligo-phenylene ether (b) to 100 parts by mass of the acid-modified polyolefin (a); and
wherein the adhesive composition satisfies the following requirement (B) and optionally further satisfies the following requirement (A):
(A) the adhesive composition comprises more than 20 parts by mass and 60 parts by mass or less of the epoxy resin (c) to 100 parts by mass of the acid-modified polyolefin (a);
(B) the adhesive composition comprises 0.5 to 20 part(s) by mass of a polycarbodiimide (d) to 100 parts by mass of the acid-modified polyolefin (a) and 0.5 to 60 part(s) by mass of the epoxy resin (c) to 100 parts by mass of the acid-modified polyolefin (a).

2. The adhesive composition according to claim 1, wherein the acid value of the acid-modified polyolefin (a) is 5 to 40 mg KOH/g.

3. The adhesive composition according to claim 1, wherein the oligo-phenylene ether (b) having a number-average molecular weight of 3000 or less has a structural unit of the following formula (I) and/or a structural unit of the following formula (II):

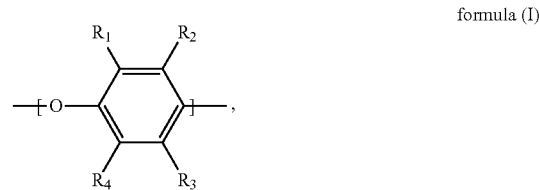
formula (I)

wherein, in the formula (I), $R_1$, $R_2$, $R_3$ and $R_4$ each independently represents a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted;

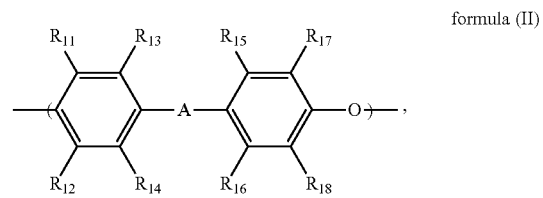
formula (II)

wherein, in the formula (II), $R_{11}$, $R_{12}$, $R_{13}$, $R_{14}$, $R_{15}$, $R_{16}$, $R_{17}$ and $R_{18}$ each independently represents a hydrogen atom, an alkyl group which may be optionally substituted, an alkenyl group which may be optionally substituted, an alkynyl group which may be optionally substituted, an aryl group which may be optionally substituted, an aralkyl group which may be optionally substituted, or an alkoxy group which may be optionally substituted; and A is a linear, branched or cyclic divalent hydrocarbon group having a number of carbon atoms of 20 or less, or oxygen.

4. The adhesive composition according to claim 1, wherein the adhesive composition has a relative dielectric constant ($\varepsilon_c$) at 1 GHz of 3.0 or less and a dielectric tangent (tan δ) at 1 GHz of 0.02 or less.

5. An adhesive sheet which comprises the adhesive composition according to claim 1.

6. A laminate which comprises the adhesive composition according to claim 1.

7. A printed-circuit board which comprises the laminate according to claim 6 as a constituting element.

8. The adhesive composition according to claim 1, comprising 0.05 to 50 part(s) by mass of the oligo-phenylene ether (b) to 100 parts by mass of the acid-modified polyolefin (a).

9. The adhesive composition according to claim 1, wherein the adhesive composition further satisfies requirement (A).

* * * * *